United States Patent  
Nguyen et al.

(10) Patent No.: US 12,494,750 B2
(45) Date of Patent: Dec. 9, 2025

(54) TEMPERATURE DEPENDENT STABILIZATION AND PEAKING CONTROL

(71) Applicant: MACOM Technology Solutions Holdings, Inc., Lowell, MA (US)

(72) Inventors: Nguyen L.K. Nguyen, San Jose, CA (US); Trong Phan, Garden Grove, CA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 691 days.

(21) Appl. No.: 17/813,508

(22) Filed: Jul. 19, 2022

(65) Prior Publication Data

US 2024/0030878 A1 Jan. 25, 2024

(51) Int. Cl.
*H03F 3/21* (2006.01)
*H03G 3/30* (2006.01)

(52) U.S. Cl.
CPC ........... *H03F 3/211* (2013.01); *H03G 3/3042* (2013.01); *H03G 2201/103* (2013.01)

(58) Field of Classification Search
CPC . H03F 3/211; H03F 3/19; H03F 3/245; H03F 1/301; H03F 2200/447; H03F 2200/451; H03G 3/3042; H03G 2201/103
USPC ................................ 330/278, 143, 289, 272
See application file for complete search history.

(56) References Cited

U.S. PATENT DOCUMENTS

| | | | | |
|---|---|---|---|---|
| 7,154,330 B2* | 12/2006 | Quek | ......................... | H03F 1/08 330/109 |
| 2004/0239424 A1* | 12/2004 | Vaara | ................... | H03F 3/45479 330/256 |
| 2023/0208374 A1* | 6/2023 | Cascio | .................. | H03F 1/0222 330/252 |

\* cited by examiner

*Primary Examiner* — Andrea Lindgren Baltzell
*Assistant Examiner* — Nareh Shamiryan
(74) *Attorney, Agent, or Firm* — Perilla Knox & Hildebrandt LLP; Jason M. Perilla

(57) ABSTRACT

Aspects of temperature dependent stabilization and peaking control in amplifiers are described. An example amplifier includes a variable gain amplifier, a power amplifier, a variable compensation element coupled to the variable gain amplifier, and a controller that directs operation of the variable compensation element to adjust one or more operating characteristics of the amplifier. In one aspect, the variable compensation element comprises a variable impedance, and the controller varies the impedance across inputs of the variable gain amplifier based on temperature to stabilize the amplifier. In another aspect, the variable compensation element comprises a negative capacitance, and the controller varies a coupling of the negative capacitance across inputs of the variable gain amplifier based on temperature to linearize gain of the amplifier. The variable compensation element can include both a variable impedance and negative capacitance, and stability, peaking control, and linearity of the amplifier can be controlled.

27 Claims, 12 Drawing Sheets

TEMPERATURE DEPENDENT STABILIZATION AND PEAKING CONTROL

BACKGROUND

An amplifier is an electronic device or circuit designed to increase the power of an input signal based on the gain of the amplifier. Gain can be defined as the ratio between the magnitudes of the output and input signals of an amplifier, and gain can be unitless and expressed in decibels. Amplifiers are typically designed to have linear gain over a certain operating frequency range or bandwidth, although amplifiers can also be designed to achieve a range of different performance characteristics depending upon the application. Other characteristics of amplifiers can be defined according to other input and output characteristics, small signal parameters, scattering parameters, and other operating characteristics.

Transistors are commonly used as amplifiers or as parts of amplifier circuits. A transistor, such as a bipolar junction transistor (BJT), can be configured as a certain type or class of amplifier based on which terminal of the transistor is common to both the input and the output of the transistor. In the case of bipolar junction transistors, the amplifier classes include common emitter, common base, and common collector. For field-effect transistors (FETs), the amplifier classes include common source, common gate, and common drain.

BRIEF DESCRIPTION OF THE DRAWINGS

Aspects of the present disclosure can be better understood with reference to the following drawings. It is noted that the elements in the drawings are not necessarily drawn to scale, with emphasis instead being placed upon illustrating the principles of the examples. In the drawings, like reference numerals designate like or corresponding, but not necessarily the same, elements throughout the several views.

DETAILED DESCRIPTION

Figure 1:
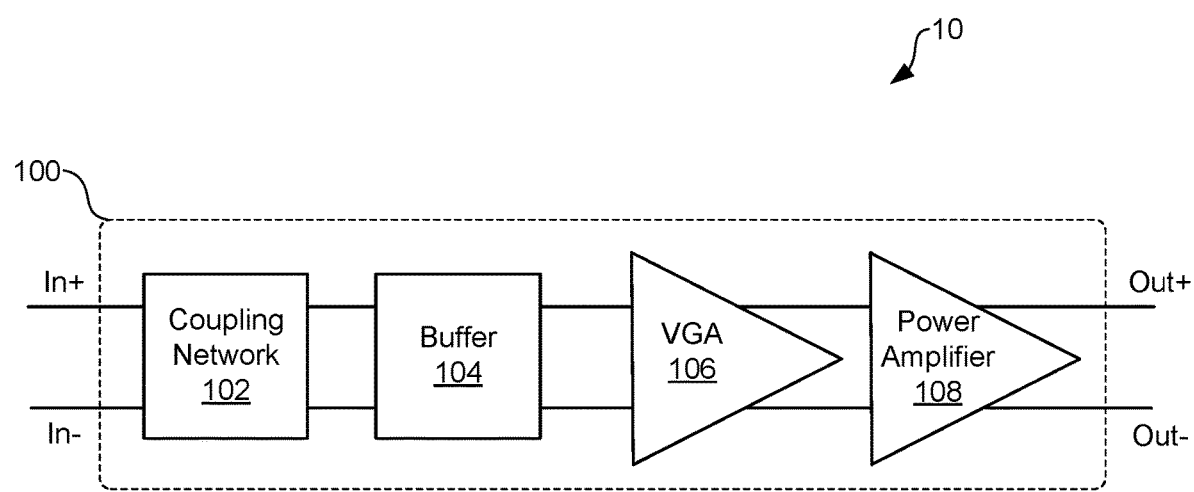
FIG. 1 illustrates an example amplifier according to certain aspects of the concepts described herein.

As noted above, an amplifier is an electronic device or circuit designed to increase the power of an input signal based on the gain of the amplifier. Amplifiers are typically designed to have linear gain over a certain operating frequency range or bandwidth, although amplifiers can also be designed to achieve a range of other performance characteristics depending upon the application. Other characteristics of amplifiers can be defined according to other input and output characteristics, small signal parameters, scattering parameters, and other operating characteristics.

The proper design of an amplifier includes the evaluation of a number of operating characteristics of the amplifier, including the gain, the operating bandwidth, the input and output characteristics, the small signal parameters, and other operating characteristics. In one approach, an amplifier circuit network can be modeled as a "black box" containing a variety of interconnected circuit components or lumped elements, such as resistors, capacitors, inductors, and transistors, which interact with other circuits through ports. The amplifier circuit network is then characterized by complex numbers called the S-parameters, which can be used to calculate the response of the amplifier to signals applied to the ports. The S-parameters of an amplifier are related to the electrical behavior of the amplifier over a range of input signals. The gain, return loss, voltage standing wave ratio (VSWR), reflection coefficient, and amplifier stability of an amplifier circuit network, including a combination of inductors, capacitors, resistors, transistors, and other components, can be expressed using the S-parameters among other operating parameters.

Among other operating characteristics, the stability of an amplifier can be an important concern. The stabilization of amplifiers can vary based on the power, temperature, bandwidth, and other operating characteristics, and it can be important to characterize the stabilization characteristics and stabilization approach for each amplifier design. A number of approaches can be relied upon to stabilize amplifiers. As one example, to stabilize a common gate transistor, shunt-connected gate capacitors, shunt-connected resistor-capacitor gate networks, drain-to-gate resistor-capacitor networks, combinations thereof, and other gate-connected networks of resistors and capacitors can be relied upon. Similar networks can be relied upon to help stabilize other transistors in amplifiers. However, the approach used to stabilize one type of amplifier for one application may not be suitable to stabilize another type of amplifier for another application.

The gain of an amplifier at a certain frequency or over a frequency range (e.g., over a bandwidth), or the gain-bandwidth product, can also be tailored for some amplifier applications. As one example, in some optical applications, optical modulators and other elements in an optical chain can experience losses over certain operating frequency ranges. Thus, an amplifier used in such applications can be designed to have peaking gain control at a certain frequency or frequency range to compensate for and help equalize the losses in the optical chain. The incorporation of peaking gain and peaking gain control in such amplifiers can be associated with instability and other issues, however. For example, such amplifiers can experience non-linear amplification and instability. The stability factor K can fall below 1 in some cases, such as at low temperatures and high operating frequencies. Other issues with peak gain control in amplifiers include relatively dramatic and unwanted changes in gain shape, non-linear gain control, and degraded bandwidth performance.

In the context outlined above, aspects of temperature dependent stabilization and peaking control for amplifiers are described herein. The temperature dependent stabilization can compensate for instability experienced in an amplifier based on the operating temperature of the amplifier. The temperature dependent stabilization can help to compensate for unwanted changes in gain based on the operating temperature of the amplifier, resulting in better stability. The peaking control can help to compensate for non-linear gain shape and peaking control in amplifiers. The temperature dependent stabilization and peaking control techniques can be used separately or in combination with each other in various embodiments.

An example amplifier according to the concepts includes a variable gain amplifier, a power amplifier, a variable compensation element coupled to the variable gain amplifier, and a controller that directs operation of the variable compensation element to adjust one or more operating characteristics of the amplifier. In one aspect, the variable compensation element comprises a variable impedance, and the controller varies the impedance across inputs of the variable gain amplifier based on temperature to stabilize the amplifier. In another aspect, the variable compensation element comprises a negative capacitance, and the controller varies a coupling of the negative capacitance across inputs of the variable gain amplifier based on temperature to linearize gain of the amplifier. The variable compensation element can include both a variable impedance and negative capacitance, and stability, peaking control, and linearity of the amplifier can be controlled.

Turning to the drawings, FIG. 1 illustrates an example amplifier 10 according to certain aspects of the concepts described herein. The amplifier 10 can be embodied as a multi-stage linear amplifier. Among other components, the amplifier 10 includes an amplifier network 100, which includes a coupling network 102, a buffer 104, a variable gain amplifier (VGA) 106, and a power amplifier 108. The amplifier 10 is provided as a representative example of one type of an amplifier in which the concepts of temperature dependent stabilization and peaking control can be implemented as described herein. The concepts can be applied to other types of amplifiers, however. The illustration of the amplifier 10 in FIG. 1 is not exhaustive, and the amplifier 10 can include other components that are not illustrated. Additionally, in some cases, one or more of the components shown in FIG. 1 can be omitted in some cases.

The amplifier 10 is designed to amplify a differential input signal provided across input terminals In+ and In−, as shown in FIG. 1, and provide an amplified differential output signal at output terminals Out+ and Out−. The amplifier 10 can be designed to provide gain over a frequency range of the differential input signal from nearly zero to over 80 GHz, 85 GHz, 90 GHz, 95 GHz or more, although the concepts described herein are not limited to amplifiers operating at any particular range of operating frequencies. The amplifier 10 and other amplifiers described herein can be implemented in various ways, such as an integrated circuit device formed on a semiconductor substrate, discrete components, or a combination of discrete components and integrated circuits.

In some cases, the amplifier 10 can be implemented or simulated on one or more computing devices. For example, one or more aspects of a semiconductor manufacturing process, such as the dopant distribution, the stress distribution, the device geometry, and other aspects of a manufacturing process to form the amplifier 10 can be simulated. Manufacturing process simulations can be relied upon to model the characteristics of the semiconductor devices (e.g., transistors) and other elements (e.g., resistors, inductors, capacitors, etc.) of the amplifier 10. One or more operational characteristics of the amplifier 10, such as the gain-bandwidth, stability, and other characteristics can also be simulated. Simulations can be relied upon to model the characteristics of the semiconductor devices (e.g., transistors) and other elements (e.g., resistors, inductors, capacitors, etc.) of the amplifier 10. Thus, the amplifier 10 can be simulated using one or more circuit simulator, semiconductor device modeling, semiconductor process simulation, or related Technology Computer Aided Design (TCAD) software tools.

The coupling network 102 can be implemented using capacitors or a capacitor network capable of coupling and isolating the differential input signal of the amplifier 10 to the buffer 104. The buffer 104 provides DC level shifting and converts a high impedance at the output of the coupling network 102 to a low impedance at the output of the buffer 104, for the input of the VGA 106. The buffer 104 can be implemented using bipolar transistors, such as bipolar junction transistors (BJTs) or heterojunction bipolar transistors (HBTs), as examples, although the buffer 104 can be implemented using field effect transistors (FETs) in other cases. The buffer 104 can include a first transistor configured in a common collector or emitter follower arrangement, with a first (e.g., In+) end of the differential input signal coupled to the base of the first transistor and an output taken from the emitter of the first transistor. The buffer 104 can also include a second transistor configured in a common collector or emitter follower arrangement, with a second (e.g., In−) end of the differential input signal coupled to the base of the second transistor and an output taken from the emitter of the second transistor. The first and second transistors in the buffer 104, and other transistors in the VGA 106 and the power amplifier 108, can be implemented in Silicon Germanium (SiGe) semiconductor materials in one example. However, other semiconductor materials and processes can be relied upon.

The VGA 106 acts as an amplifier stage and amplifies the differential input signal provided from the buffer 104. The output of the VGA 106 is provided as an input to the power amplifier 108. The VGA 106 can be configured to provide a variable gain, to vary the gain characteristics of the amplifier 10 over certain operating frequencies. In other cases, the VGA 106 can be implemented as a fixed gain amplifier, similar to a pre-amplifier in other multi-stage amplifiers. The VGA 106 can be implemented as a differential amplifier stage including a pair of emitter-coupled BJT transistors in one example. In that case, the output of the first transistor of the buffer 104 is coupled to the base of a first transistor of the pair of emitter-coupled BJT transistors, and the output of the second transistor of the buffer 104 is coupled to the base of a second transistor of the pair of emitter-coupled BJT transistors. The VGA 106 can also be implemented using other transistors in some cases, including HBTs, FETs, or other types of transistors, and the VGA 106 can also be implemented as a multi-stage differential amplifier, among other amplifier topologies.

The power amplifier 108 can be implemented as another differential amplifier stage including a pair of emitter-coupled BJT transistors in one example. In some cases, buffer or level shifting transistors can be coupled between the VGA 106 and the power amplifier 108. A first output of the VGA 106 is coupled to the base of a first transistor of the pair of emitter-coupled BJT transistors in the power amplifier 108, and a second output of the VGA 106 is coupled to the base of a second transistor of the pair of emitter-coupled BJT transistors in the power amplifier 108. The power amplifier 108 can also be implemented using other transistors in some cases, including HBTs or FETs, and the power amplifier 108 can also be implemented using other amplifier topologies.

Figure 2A:
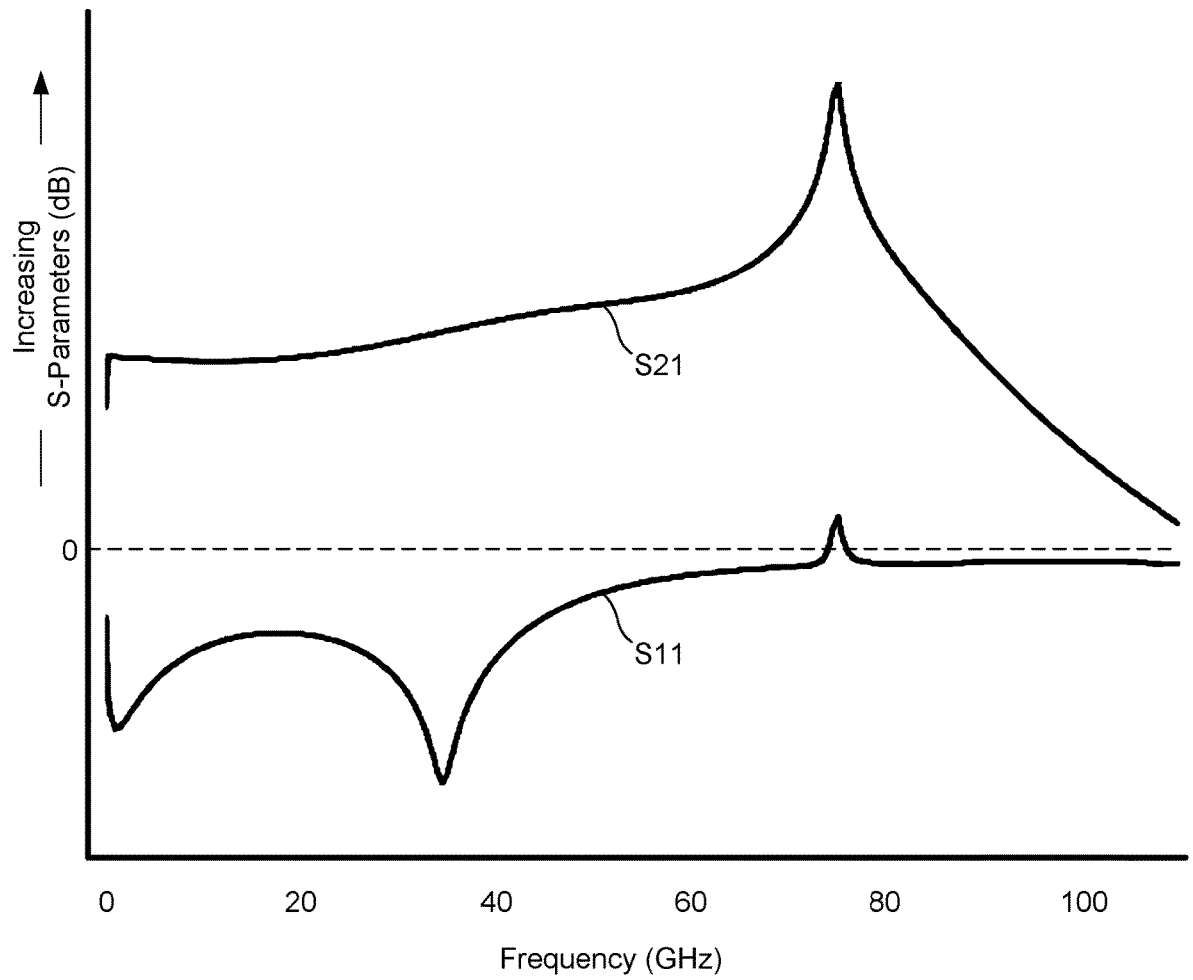
FIG. 2A illustrates a representative plot of input return loss and power gain, across operating frequency, of the amplifier shown in FIG. 1 according to certain aspects of the concepts described herein.

With the high gain, wide operating bandwidth, and multi-stage differential amplifier design of the amplifier 10, it can exhibit instability in some cases and operating conditions. As an example of instability in the amplifier 10, FIG. 2A illustrates a representative plot of input return loss (S11) and power gain (S21), across operating frequency, for the amplifier 10 shown in FIG. 1. The S11 and S21 curves in FIG. 2A are provided as a representative example of operating characteristics of the amplifier 10 under conditions leading to instability, such as at high frequency (e.g., above about 70 GHz or other frequency) and low temperature (e.g., below about −5° C. or other temperature).

Particularly, leading to higher operating frequencies, the input return loss S11 curve increases above and peaks at a value over 0 decibels (dB) in FIG. 2A, which indicates instability. The gain of the amplifier 10 also increases rapidly and peaks, as shown on the S21 curve. Significant increases in gain and peaks of the type shown in FIG. 2A are typically associated with degraded bandwidth and linearity performance. Additionally, the K factor is not plotted in FIG. 2A, but the K factor of the amplifier 10 at the peak of the input return loss S11 curve is also less than 1, which also indicates instability. The K factor of the amplifier 10 can be similar to the K factor curve 177 in FIG. 6, for example, as described below. The amplifier 10, as well as other amplifiers of similar design, can also encounter instabilities at other operating frequencies and temperatures, depending on the design.

During operation of the amplifier 10 under conditions leading to the instabilities described above, a negative resistance presents itself at the input of the VGA 106. The negative resistance can be present at the input of the VGA 106, and the negative resistance can propagate through the buffer 104 and the coupling network 102, to the input of the amplifier 10. This negative resistance can lead to the higher input return losses at the input of the amplifier 10, as shown on the S11 curve. For stable operation, however, the input return loss of the amplifier 10 should be maintained below zero on the dB scale over the full operating frequency and temperature range.

Thus, in aspects of the embodiments, a temperature dependent variable compensation element, such as a variable impedance or resistance, can be coupled at the input of the VGA 106, as described in further detail below with reference to FIG. 3. The variable impedance can help to offset or compensate for the negative resistance at the VGA 106, helping to maintain stable operation of the amplifier 10 even at low temperatures and high operating frequencies.

The impedance of the compensation element can be adjusted over temperature as described below, such as from an infinite (or near infinite) impedance at higher temperatures, to a lower impedance at lower temperatures, based on a temperature compensation profile implemented using a temperature compensation controller, as described below.

Figure 2B:
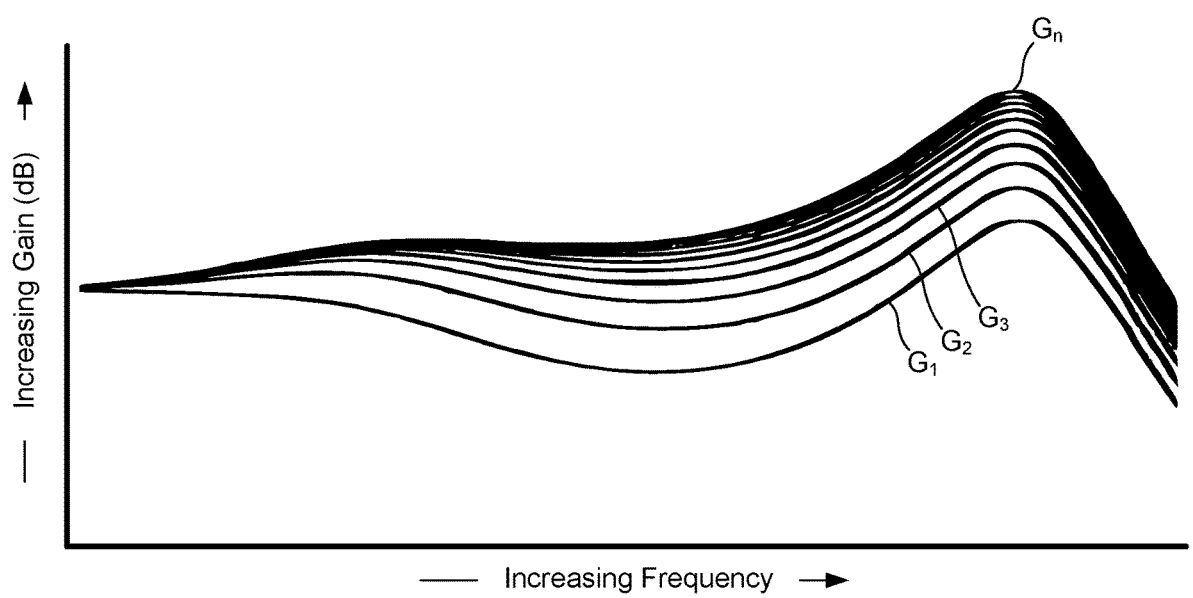
FIG. 2B illustrates a representative plot of gain peaking curves of the amplifier shown in FIG. 1 across operating frequency according to certain aspects of the concepts described herein.

Turning to other operating characteristics of the amplifier 10, FIG. 2B illustrates a representative plot of gain peaking curves of the amplifier 10 across operating frequency, for a number of gain peaking settings of the amplifier 10. In FIG. 2B, each of the curves $G_1$-$G_n$ is plotted for a different gain peaking setting of the amplifier 10, which can be varied. Thus, the gain peaking setting of the amplifier 10 can be designed to provide larger peaking in some settings. However, the gain of the amplifier 10 is not linear across the operating bandwidth of the amplifier 10, particularly for the lower peaking settings of the amplifier 10. Particularly at lower peaking settings (e.g., for curves $G_1$-$G_3$, among others), the curves exhibit greater non-linearity than at higher peaking settings (e.g., for curves $G_n$, $G_{n-1}$, etc.). Thus, the useful peaking control range of the amplifier 10 is somewhat limited to higher peaking settings to maintain linearity in peaking control across operating frequencies. In some designs, this variation in gain linearity has been compensated between the VGA 106 and the power amplifier 108, although it can be difficult to provide compensation at this point in the amplifier 10, as the signal levels between the VGA 106 and the power amplifier 108 are relatively large.

Thus, in other aspects of the embodiments, a compensation element, such as a capacitance or negative capacitance, can be coupled at the input of the VGA 106, as described in further detail below with reference to FIG. 7. The variable negative capacitance can help to compensate for the non-linearity in the gain of the amplifier across operating frequencies. The coupling of the negative capacitance can be adjusted based on the temperature of the amplifier 10, the peaking setting of the amplifier 10, or based on other operating characteristics.

Figure 3:
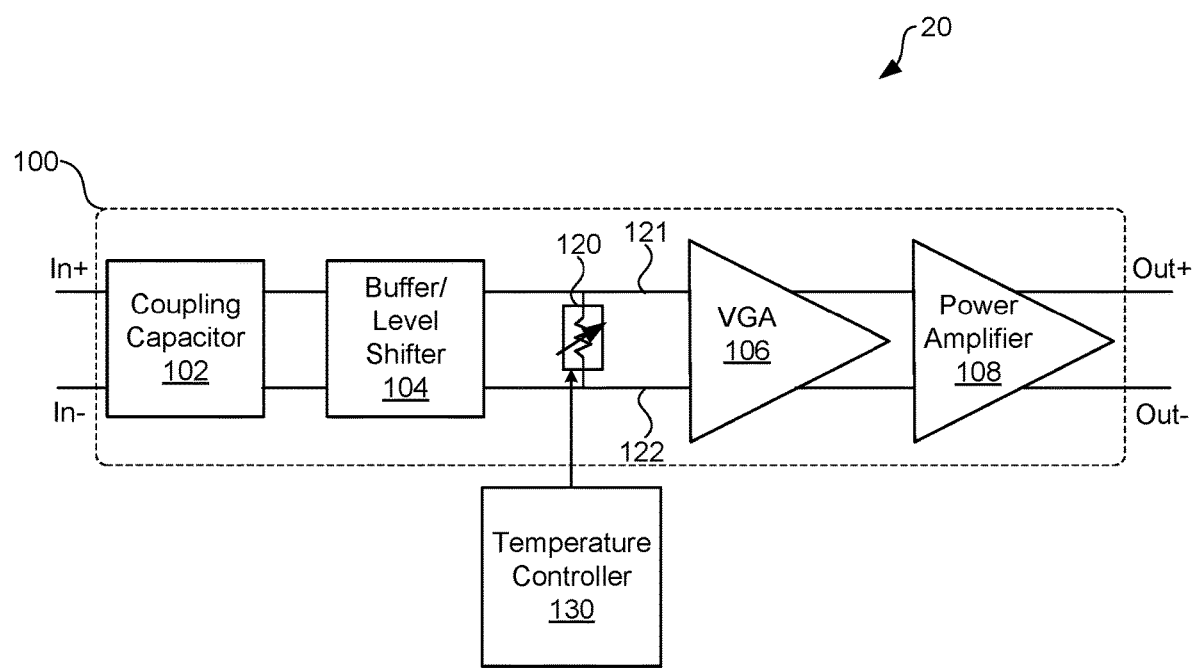
FIG. 3 illustrates an example amplifier with temperature dependent stability compensation according to various aspects of the embodiments described herein.

According to one embodiment, FIG. 3 illustrates an example amplifier 20 with temperature dependent stability compensation. Similar to the amplifier 10, the amplifier 20 can experience a negative resistance at the input of the VGA 106, particularly at low temperatures and over certain operating frequencies, leading to instability. To address those operating issues, the amplifier 20 also includes a variable resistance 120 coupled between the non-inverting input 121 and the inverting input 122 of the VGA 106. The variable resistance 120 is an example of a compensation element or variable compensation element in the amplifier 20.

The amplifier 20 also includes a temperature controller 130. The temperature controller 130 is configured to direct or control the variable resistance 120 to adjust one or more operating characteristics of the amplifier, as described herein. For example, based on a control signal provided by the temperature controller 130, an impedance of the variable resistance 120 is configured to approach an infinite (or near infinite) resistance or impedance at higher temperatures and a lower resistance or impedance at lower temperatures. Thus, at higher temperatures, the variable resistance 120 behaves as open circuit and does not (or does not significantly) impact the operation of the amplifier 20. At lower temperatures, the variable resistance 120 balances against the negative resistance experienced at the input of the VGA 106, stabilizing the operation of the amplifier 20.

Figure 4:
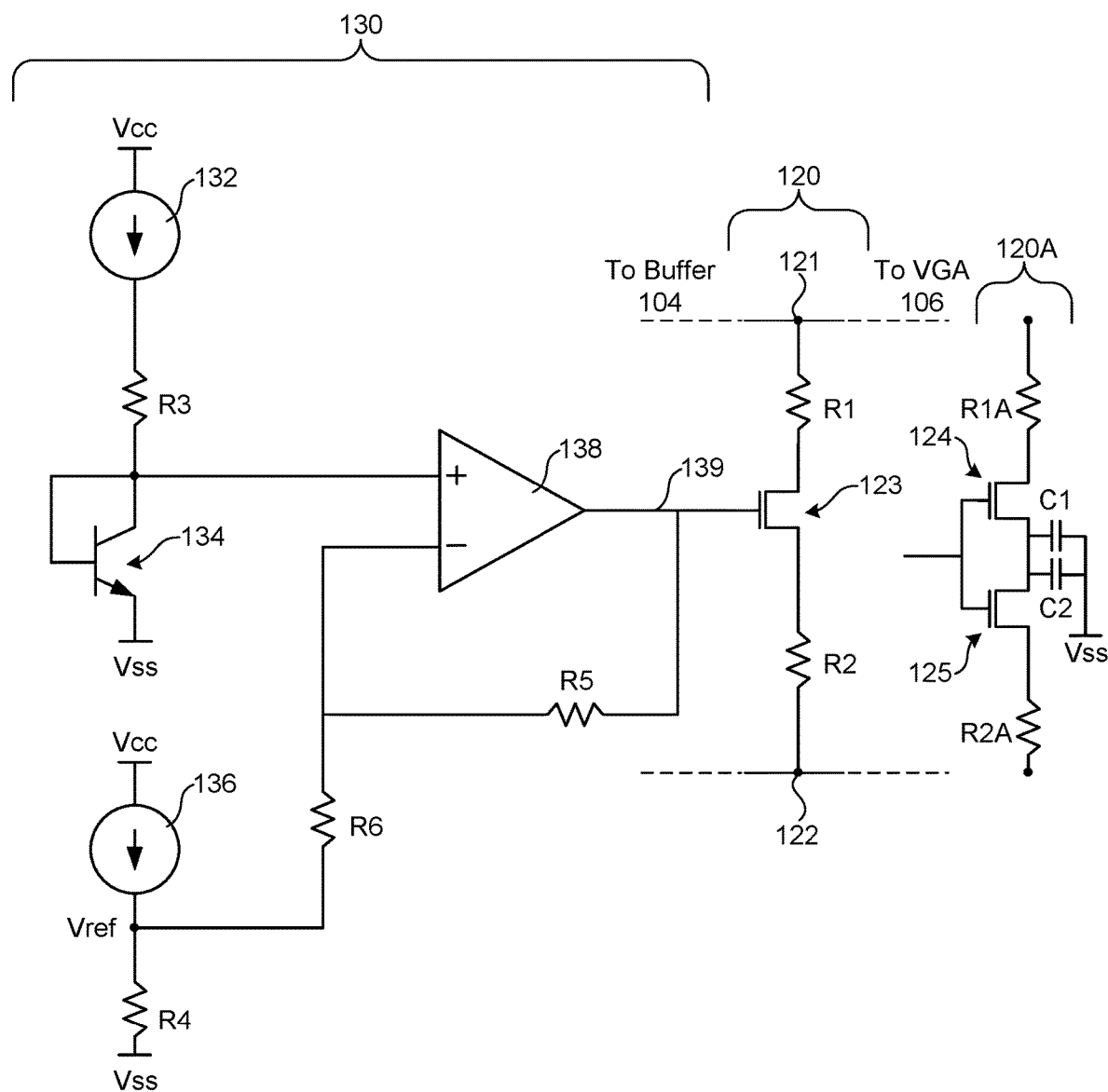
FIG. 4 illustrates an example of variable resistance and temperature controller of the amplifier shown in FIG. 3 according to various aspects of the embodiments described herein.

FIG. 4 illustrates an example of the variable resistance 120 and the temperature controller 130 of the amplifier 20 shown in FIG. 3. The variable resistance 120 is coupled in the chain of the amplifier 20 between the non-inverting input 121 of the VGA 106 and the inverting input 122 of the VGA 106. In one example, the variable resistance 120 includes a first resistor R1, a transistor 123, and a second resistor R2, coupled in series. The first and second resistors R1 and R2 can help to isolate the transistor 123 and also provide a baseline minimal resistance of the variable resistance 120. In some cases, the first resistor R1, the second resistor R2, or both the first and second resistors R1 and R2 can be omitted.

The transistor 123 can be implemented as a FET transistor, such as an n-type FET (nFET), although other types of transistors can be relied upon in some cases. The gate of the transistor 123 can be coupled to a control signal 139 provided by the temperature controller 130, as described below. Thus, the operation of the transistor 123 is controlled by the control signal 139 from the temperature controller 130, and the transistor 123 and can be driven fully on (e.g., driven into the active or saturated region of operation), driven fully off (e.g., driven to the cutoff region of operation), or operated in the ohmic region.

The overall resistance of the variable resistance 120 is a combination of the sum of the resistances provided by the series combination of the first resistor R1, the transistor 123, and the second resistor R2. Thus, when the transistor 123 is fully on, the overall resistance of the variable resistance 120 is a combination of the sum of the first resistor R1, the $R_{ON}$ of the transistor 123 in the saturated region, and the second resistor R2. In this case, the overall resistance of the variable resistance 120 can be dominated by the resistances of the first and second resistors R1 and R2, as the $R_{ON}$ of the transistor 123 in the saturated region can be relatively low. The resistance values of the first and second resistors R1 and R2 can be selected, together, to provide a baseline minimal resistance of the variable resistance 120 when the transistor 123 is driven fully on. When the transistor 123 is driven fully off, the overall resistance of the variable resistance 120 can be dominated by the $R_{OFF}$ of the transistor 123, as the $R_{OFF}$ of the transistor 123 in the cutoff region can be relatively high, and the variable resistance 120 can behave as an electrical "open" in this condition.

In another example, the variable resistance 120 can be implemented as (i.e., replaced by) the variable resistance 120A. The variable resistance 120A includes a first resistor R1, first transistor 124, a second transistor 125, and a second resistor R2, coupled in series. The source of the first transistor 124 is coupled to the drain of the second transistor 125. The variable resistance 120A can also include shunt capacitors C1 and C2, to provide better common mode rejection, although the capacitors C1 and C2 can be omitted in some cases. When included, the capacitors C1 and C2 are coupled between the first and second transistors 124 and 125 and Vss or ground. The first and second transistors 124 and 125 can be implemented as nFETs. The gates of the first and second transistors 124 and 125 are coupled together, and the control signal 139 from the temperature controller 130 is coupled to the gates of the first and second transistors 124 and 125. The use of the first and second transistors 124 and 125 in the variable resistance 120A can help with common mode suppression of the amplifier 20. The variable resistances 120 and 120A can also be implemented in other ways, using other combinations of resistors or resistor networks, resistor and capacitor networks, and other lumped elements in some cases.

The temperature controller 130 operates as a temperature-dependent control circuit for the amplifier 20. The temperature controller 130 generates a temperature-dependent voltage as the control signal 139, which is provided as an input to the variable resistance 120. The configuration of the temperature controller 130, as illustrated in FIG. 4, is provided as a representative example. The temperature controller 130 can vary as compared to that shown in FIG. 4. For example, the temperature controller 130 can include other components not illustrated or omit some elements in some cases. The temperature controller 130 can also be configured for control that is complementary to the absolute operating temperature of the amplifier 20, as shown in FIG. 4, or for control that is proportional to the absolute operating temperature of the amplifier 20, as described below.

As shown in FIG. 4, the current source 132 sources a constant (e.g., temperature-invariant) current through a temperature-dependent impedance network, such as a resistor R3 and a diode-connected BJT 134, to generate a temperature profile voltage. The emitter of the transistor 134 is coupled to Vss or ground in the example shown in FIG. 4, although the transistor 134 can also be coupled to ground through another series-connected resistor in some cases. The operating characteristics of the diode-connected BJT 134 can vary based on the operating temperature of the amplifier 20. Particularly, the impedance or resistance across the diode-connected BJT 134 can vary based on the operating temperature of the amplifier 20. Thus, the voltage at the collector of the transistor 134 will vary based on the operating temperature of the amplifier 20, given the same current from the current source 132. This temperature profile voltage at the collector of the transistor 134 is provided at a non-inverting input of a difference operational amplifier 138. For complimentary control, the voltage at the collector of the transistor 134 (i.e., the temperature profile voltage provided at the non-inverting input of the operational amplifier 138) is larger a lower operating temperature of the amplifier 20 and smaller for a higher operating temperature of the amplifier 20. For proportional control, the temperature profile voltage is smaller a lower operating temperature of the amplifier 20 and a larger for a higher operating temperature of the amplifier 20, as described in additional detail below.

In another example, the current source 132 can be implemented as a temperature-dependent current source 132, and the diode-connected BJT 134 can be omitted. In this case, the temperature-dependent current source 132 sources current through the resistor R3 (or a resistor divider network including the resistor R3) based on the operating temperature of the amplifier 20, and a voltage across the resistor R3 (or taken from another node in the resistor divider network) can be provided as a temperature profile voltage at the non-inverting input of the difference operational amplifier 138. For complimentary control, the temperature profile voltage provided at the non-inverting input of the operational amplifier 138 is larger for a lower operating temperature of the amplifier 20 and smaller for a higher operating temperature of the amplifier 20. For proportional control, the temperature profile voltage is smaller for a lower operating temperature of the amplifier 20 and larger for a higher operating temperature of the amplifier 20.

The temperature controller 130 also includes a reference current source 136 and a resistor R4. The reference current source 136 sources a current through the resistor R4, which is coupled at one end to Vss or ground. The Vref voltage across the resistor R4 is provided as input to a resistor divider network formed by resistors R5 and R6 and, in part, controls the scale position of the voltage profile of the control signal 139, as described in further detail below with reference to FIG. 5A. The reference current source 136 can be a fixed current reference source in one example. In another example, the reference current source 136 can be implemented as a temperature-dependent current source based on the operating temperature of the amplifier 20. In other cases, the current sourced by the current source 136 can be adjusted based on other operating characteristics, parameters, or control of the amplifier 20.

The resistor divider network formed by resistors R5 and R6 sets a gain of the difference amplifier 138. The resistor R5 is coupled between the output of the difference amplifier 138 and the inverting input of the difference amplifier 138. The resistor R6 is coupled at one end to the inverting input of the difference amplifier and at another end to a node between the reference current source 136 and the resistor R4. The resistor divider network sets a gain of the difference amplifier 138 and determines a slope of the temperature profile of the control signal 139, as described in further detail below with reference to FIG. 5A. The resistances of the resistors R5 and R6 can be selected by design for a desired temperature profile of the control signal 139. Alternatively, the resistances of one or both of the resistors R5 and R6 can be variable and varied during operation of the amplifier 20, to alter the slope of the temperature profile of the control signal 139 during operation.

The temperature controller 130 shown in FIG. 4 operates complementary to the absolute operating temperature of the amplifier 20, because the input to the non-inverting input of the difference amplifier 138 is lower for higher operating temperatures of the amplifier 20 and higher for lower operating temperatures of the amplifier 20. In other cases, the temperature controller 130 can operate proportional to the absolute operating temperature of the amplifier 20, and the difference amplifier 138 can be coupled with the non-inverting input of the difference amplifier 138 coupled to the collector of the transistor 134. In still other cases, the temperature controller 130 can operate proportional to the absolute operating temperature of the amplifier 20, the difference amplifier 138 can be coupled with the inverting input of the difference amplifier 138 coupled to the collector of the transistor 134 as shown in FIG. 4, and the transistor 123 of the variable resistance 120 can be implemented as p-type FET transistor for similar operation. Other variations of the temperature controller 130 are within the scope of the embodiments.

Figure 5A:
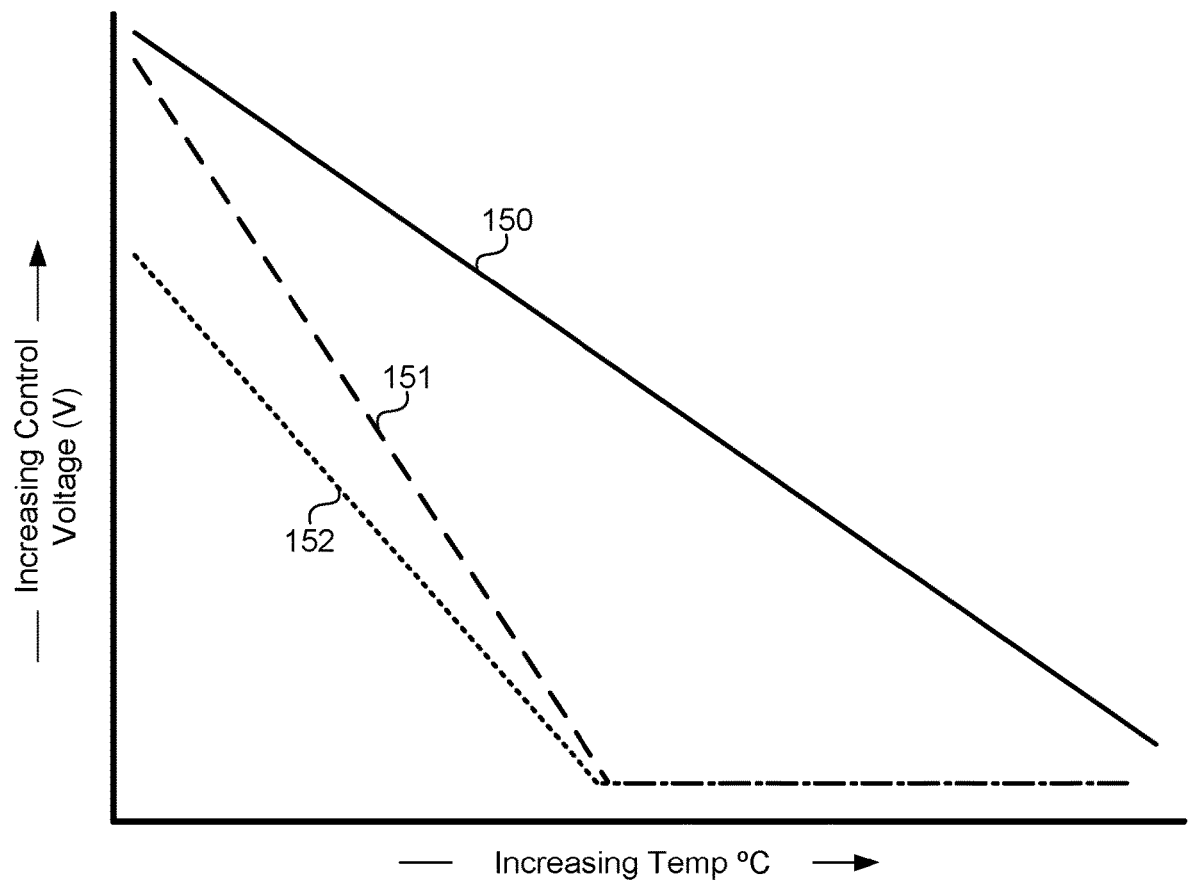
FIG. 5A illustrates example temperature compensation profiles of the temperature controller shown in FIG. 4 according to various aspects of the embodiments described herein.

FIG. 5A illustrates example temperature compensation profiles of the temperature controller 130 shown in FIG. 4 according to various aspects of the embodiments described herein. Particularly, control signal profiles 150-152, which are representative of the voltage of the control signal 139, are shown in FIG. 4. The slope of the compensation profile (e.g., the difference in the slope between the profiles 150 and 151) of the temperature controller 130 can be varied from the control signal profile 150 to the control signal profile 151 by varying the divider network formed by resistors R5 and R6. The resistances of the resistors R5 and R6 can be selected by design for a desired temperature profile of the control signal 139. Alternatively, the resistances of one or both of the resistors R5 and R6 can be variable and varied during operation of the amplifier 20, to alter the slope of the temperature profile of the control signal 139 during operation.

The scale position of the temperature compensation profile (e.g., the difference between the profiles 150 and 152) of the temperature controller 130 can be varied from the control signal profile 150 to the control signal profile 152 by varying the value of Vref. Vref can be selected by design and fixed for a desired temperature profile of the control signal 139, by selection of the current sourced by the reference current source 136, selection of the resistance of the resistor R4, or section of a combination of the current and the resistance. Alternatively, the reference current source 136 can be implemented as a temperature-dependent current source based on the operating temperature of the amplifier 20, and Vref can vary based on the operating temperature. In other cases, the current sourced by the current source 136 can be adjusted based on other operating characteristics, parameters, or control of the amplifier 20.

Figure 5B:
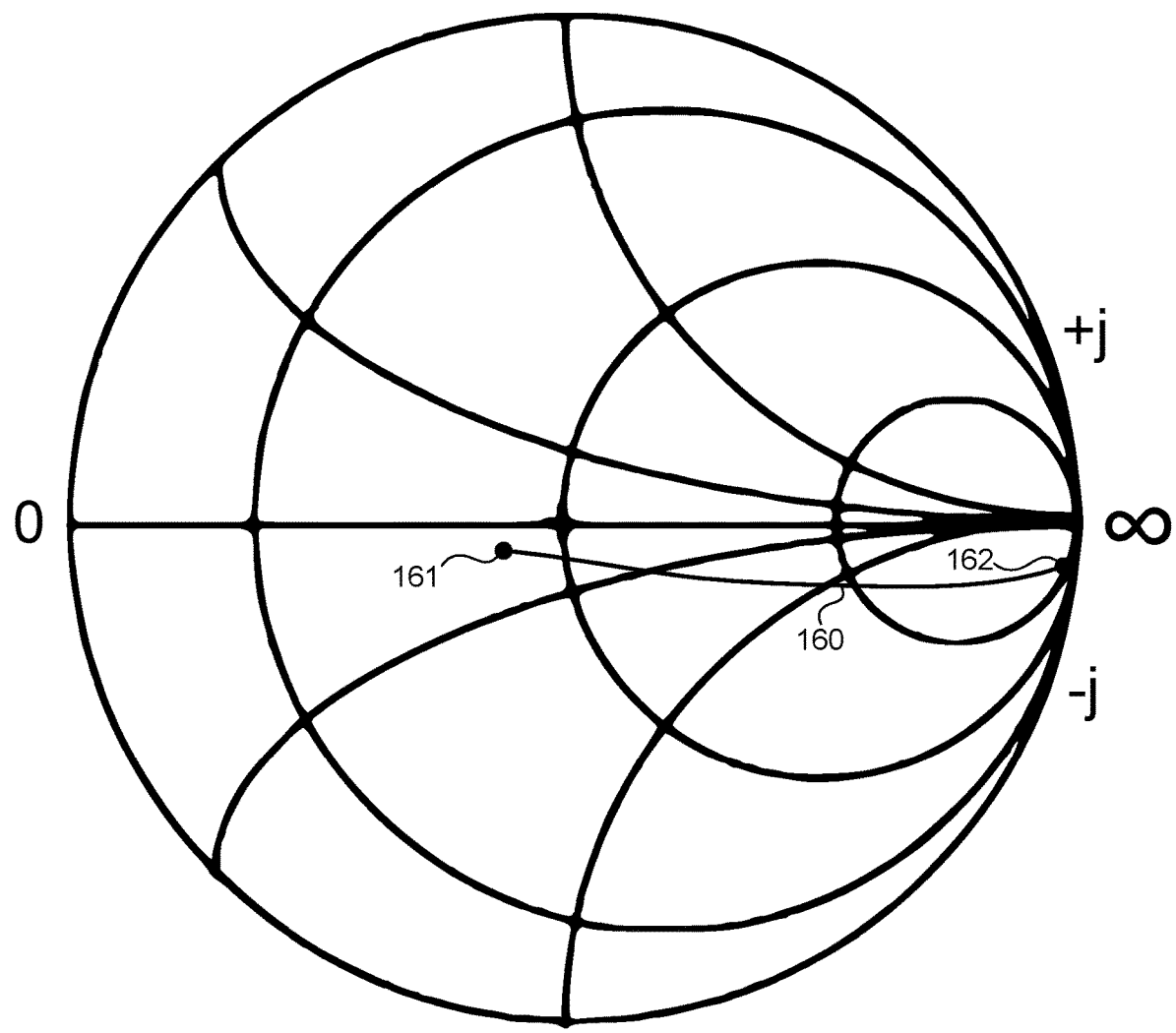
FIG. 5B illustrates an example impedance curve of the variable resistance in the amplifier shown in FIG. 3 according to various aspects of the embodiments described herein.

FIG. 5B illustrates an example impedance curve 160 of the variable resistance 120 in the amplifier 20 shown in FIG. 3, as varied based on the control signal 139. The impedance curve 160 is illustrated as a representative example in FIG. 5B and can vary as compared to that shown. The characteristics of the impedance curve 160 will depend on the design of the variable resistance 120, as shown in FIG. 2, such as the resistances of the first and second resistors R1 and R2, the resistance and capacitance presented across the transistor 123, and any other parasitic impedances of the variable resistance 120. The resistance and capacitance presented across the transistor 123, including any parasitic resistances and capacitances, depend on the control signal 139.

At the end 161 of the impedance curve 160, the transistor 123 is driven fully on (e.g., driven into the active or saturated region of operation) or nearly fully on by the control signal 139. The transistor 123 of the variable resistance 120 may be driven on for lower operating temperatures of the amplifier 20, as described herein. In this configuration, the variable resistance 120 presents a relatively low impedance between the non-inverting input 121 of the VGA 106 and the inverting input 122 of the VGA 106, to balance against the negative resistance experienced at the input of the VGA 106 at low temperatures, stabilizing the operation of the amplifier 20 across the operational bandwidth of the amplifier 20.

At the end 162 of the impedance curve 160, the transistor 123 is fully off (e.g., driven to the cutoff region of operation) or nearly fully off. The transistor 123 of the variable resistance 120 may be turned off for higher operating temperatures of the amplifier 20, as described herein. In this configuration, the variable resistance 120 presents a relatively high (e.g., infinite or nearly infinite) impedance between the non-inverting and inverting inputs 121 and 122 of the VGA 106. In this case, the variable resistance 120 is similar to an open circuit and does not (or does not significantly) impact the operation of the amplifier 20.

Figure 6:
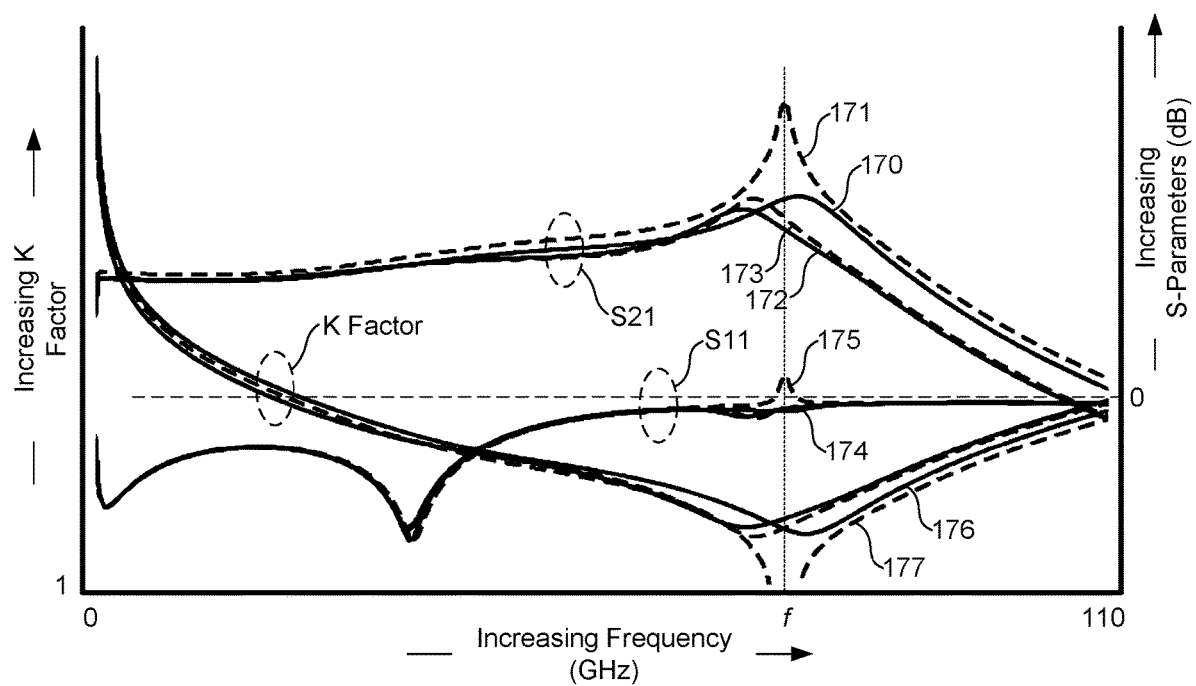
FIG. 6 illustrates a representative plot of input return loss, power gain, and K factor, across operating frequency for different operating temperatures, of the amplifier shown in FIG. 3 according to certain aspects of the concepts described herein.

FIG. 6 illustrates a representative plot of input return loss (S11), power gain (S21), and K factor, across operating frequency for different operating temperatures, of the amplifier 30 shown in FIG. 3. The input return loss (S11), power gain (S21), and K factor curves were taken at different operating temperatures for the amplifier 20. In FIG. 6, the Y-axis at the left is associated with the magnitude of the K factor for the amplifier 20, and the Y-axis at the right is associated with the magnitude of the S-parameters S11 and S21 for the amplifier 20.

In FIG. 6, the solid curves were captured with the use of temperature stabilization as described herein, and the dashed curves were captured without the use of temperature stabilization. Curves 170-173 are power gain (S21) curves, curves 174 and 175 are input return loss (S11) curves, and the curves 176 and 177 are K factor curves. The power gain (S21) curves 170 and 171 were captured for a lower operating temperature (e.g., at about −5° C.) of the amplifier 20, and the power gain (S21) curves 172 and 173 were captured for a higher operating temperature (e.g., at about 95° C.) of the amplifier 20. The input return loss (S11) curve 174 and the K factor curve 176 were captured for the lower operating temperature of the amplifier 20, and the input return loss (S11) curve 175 and the K factor curve 177 were captured for the higher operating temperature of the amplifier 20.

As shown between the difference in the input return loss (S11) curves 174 and 175, the curve 175 peaks at a value over 0 decibels (dB) at the operating frequency f, similar to the operation of the amplifier 10 (see FIG. 2A), which indicates instability, but the curve 174 does not. Additionally, as shown between the difference in the K factor curves 176 and 177, the curve 176 maintains a K factor above 1, even at the operating frequency f, but the curve 177 exhibits a K factor that drops below 1 at the frequency f, which indicates instability. The benefits of the use of the temperature stabilization concepts are also apparent by comparing the power gain (S21) curves 170-173. At the lower operating temperature, the temperature stabilized power gain (S21) curve 170 exhibits a significantly lower peak than the non-stabilized power gain (S21) curve 171. At the higher operating temperature, the temperature stabilized power gain (S21) curve 172 is similar to the non-stabilized power gain (S21) curve 173.

Thus, particularly at the lower operating temperature of the amplifier 20, the use of the temperature stabilization concepts described herein are shown to help stabilize the operation of the amplifier 20. Additionally, the gain curves of the amplifier 20 are grouped and maintained within a relatively narrow range across gain settings of the amplifier 20. Further, the common mode performance and large signal performance of the amplifier 20 are be maintained using the temperature stabilization concepts.

In other aspects of the embodiments, the variable resistance 120 can be controlled by a control signal other than the control signal 139 from the temperature controller 130. For example, the variable resistance 120 can be controlled to include or omit more or less impedance between the non-inverting input 121 of the VGA 106 and the inverting input 122 of the VGA 106 based on the desired gain of the amplifier 20. To the extent that the variable resistance 120 alters the gain of the amplifier 20, the variable resistance 120 can be controlled to adjust the gain of the amplifier 20 rather than (or in addition) to compensate for instability at lower operating temperatures. In one example, the variable resistance 120 can be controlled by a gain controller of the amplifier 20 to tune (or fine tune) the gain of the amplifier 20, at any operating temperature.

Figure 7:
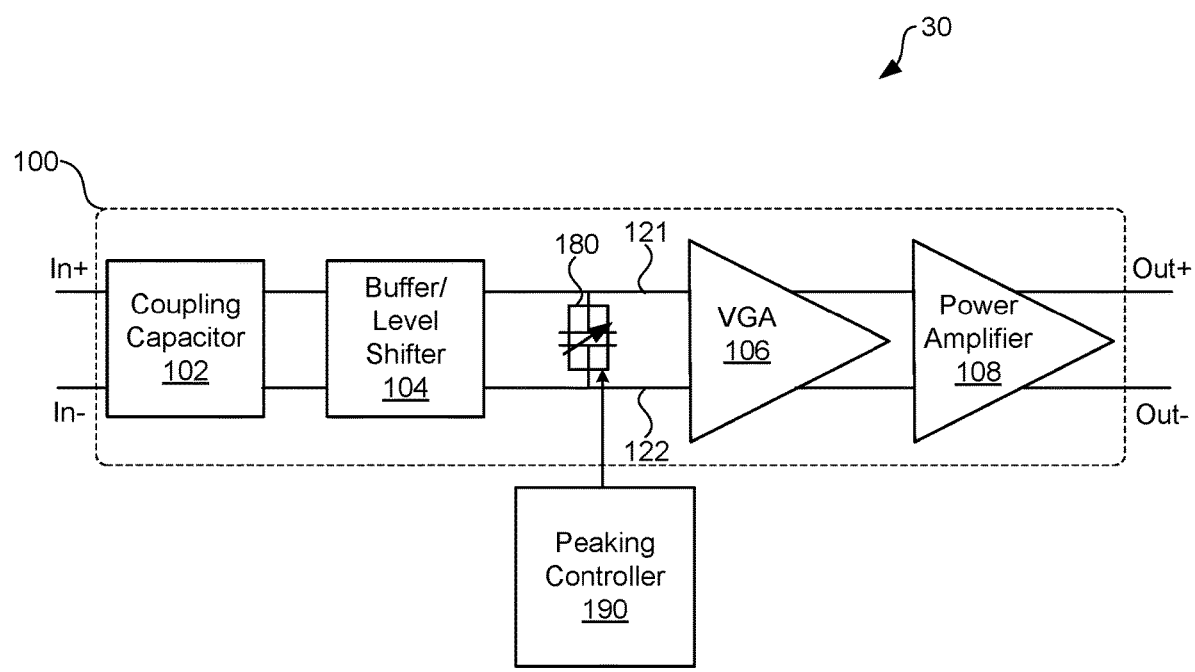
FIG. 7 illustrates an example amplifier with peaking control compensation according to various aspects of the embodiments described herein.

Turning to another embodiment, FIG. 7 illustrates an example amplifier 30 with peaking control compensation. Similar to the amplifier 10 shown in FIG. 1, the amplifier 30 can experience non-linear gain across the operating bandwidth of the amplifier 10, particularly for lower peaking settings of the amplifier 30. In some designs, this variation in gain linearity has been compensated for between the VGA 106 and the power amplifier 108, although it can be difficult to provide compensation at this point in the amplifier 30, as the signal levels between the VGA 106 and the power amplifier 108 are relatively large. To address those operating issues, the amplifier 30 also includes a capacitance or negative capacitance 180 coupled between the non-inverting and inverting inputs 121 and 122 of the VGA 106. The negative capacitance 180 is an example of a compensation element in the amplifier 30. The amplifier 30 also includes a peaking controller 190. Based on a control signal provided by the peaking controller 190, the negative capacitance 180 can be variably added or coupled between the non-inverting input 121 and the inverting input 122.

Figure 8:
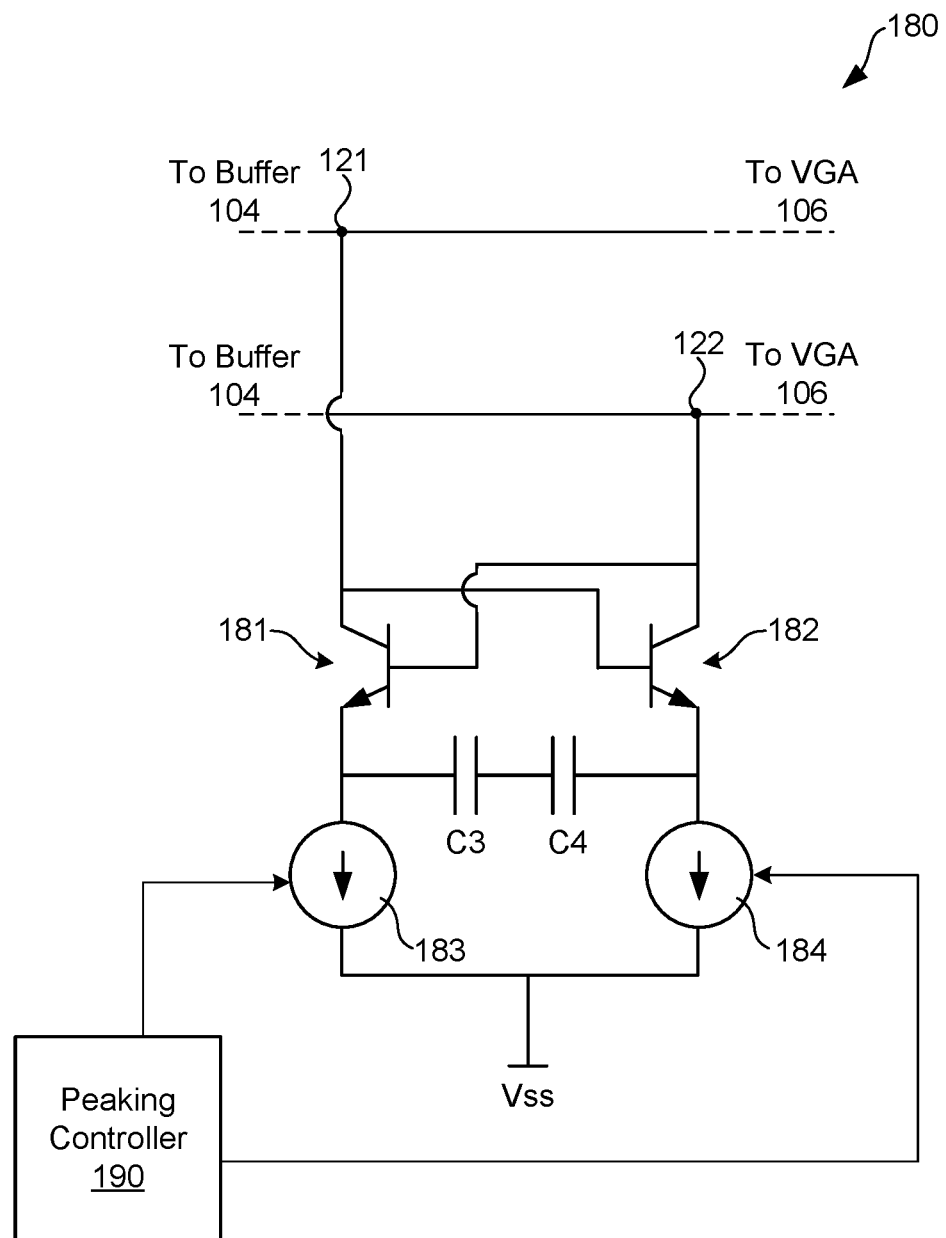
FIG. 8 illustrates an example variable negative capacitance of the amplifier shown in FIG. 7 according to various aspects of the embodiments described herein.

FIG. 8 illustrates an example of the negative capacitance 180 of the amplifier 30 shown in FIG. 7. In the example shown, the negative capacitance 180 includes a pair of cross-coupled bipolar junction transistors 181 and 185. In other cases, the transistors 181 and 185 can be implemented using other types of transistors, including FETs. The base of the transistor 181 is coupled to the collector of the transistor 182, and the base of the transistor 182 is coupled to the collector of the transistor 181 in that configuration. A first current source 183 is coupled between the emitter of the transistor 181 and ground or Vss, and a second current source 184 is coupled between the emitter of the transistor 182 and ground or Vss. A pair of capacitors C3 and C4 are coupled in series between the emitters of the transistors 181 and 182, for symmetry. In some cases, a single capacitor can be implemented in place of the pair of capacitors C3 and C4. The capacitance of the capacitors C3 and C4 can be relatively small and tailored for the desired peaking control of the amplifier 30.

The collector of the transistor 181 is coupled to the non-inverting input 121 of the VGA 106, and the collector of the transistor 182 is coupled to the inverting input 122 of the VGA 106. In effect, the cross coupling of the bipolar junction transistors 181 and 185 inverts the impedance of the pair of capacitors C3 and C4, such that the inverse (or negative) of the impedance of the capacitors C3 and C4 is coupled between the non-inverting and inverting inputs 121 and 122 of the VGA 106.

The inverted or negative impedance of the capacitors C3 and C4 can be variably added or coupled between the non-inverting and inverting inputs 121 and 122 based on current control of the current sources 183 and 184 by the peaking controller 190, as needed for peaking control or gain adjustment of the amplifier 30. For example, when the current sources 183 and 184 are controlled to a smaller current by the peaking controller 190, a smaller negative capacitance is coupled between the non-inverting and inverting inputs 121 and 122. When the current sources 183 and 184 are controlled to a larger current by the peaking controller 190, a larger negative capacitance is coupled between the non-inverting and inverting inputs 121 and 122.

In one example, the peaking controller 190 can be implemented to generate control signals for the current sources 183 and 184 that are similar to (or the same as) the control signal 139 provided by the temperature controller 130 described above with reference to FIG. 4. Thus, the peaking control provided by the variable negative capacitance 180 can also be directed based on the operating temperature of the amplifier 30, using the same or similar temperature compensation profile as that provided by the temperature controller 130. In that case, the peaking controller 190 can be implemented the same way as the temperature controller 130. With control of the peaking controller 190 based on temperature, the variable negative capacitance 180 can help to linearize the gain of the amplifier 30 over its operating bandwidth, as described below with reference to FIG. 9. However, in other cases, the peaking controller 190 can be implemented in other ways, such as by a gain controller of the amplifier 30 to tune (or fine tune) the gain of the amplifier 30, at any operating temperature.

Figure 9:
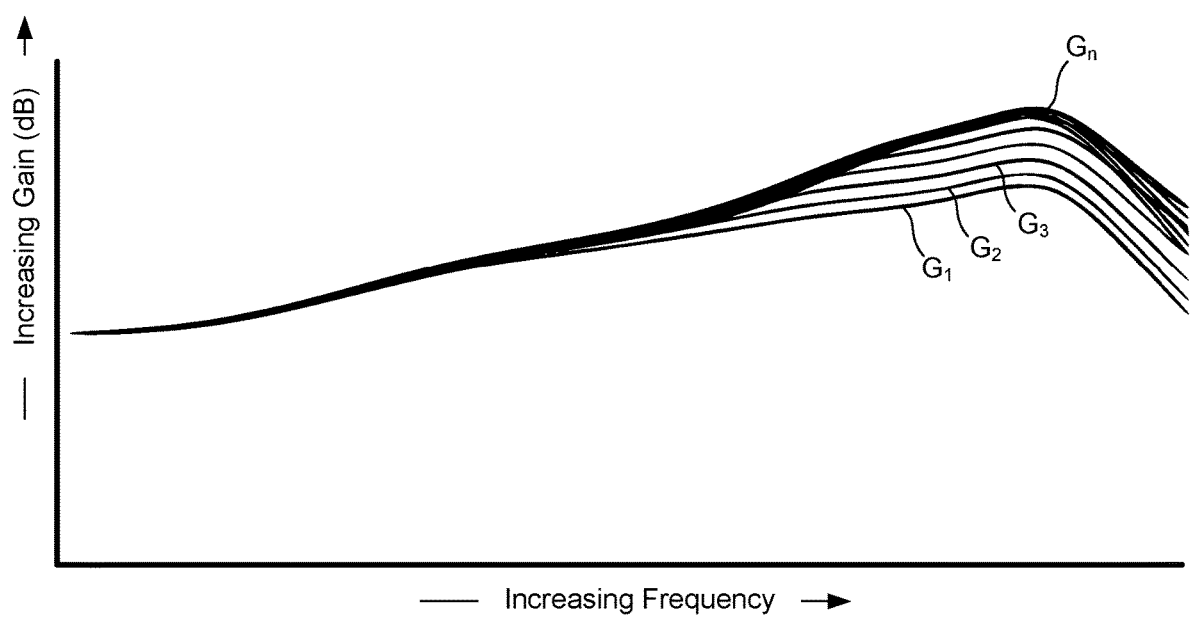
FIG. 9 illustrates a representative example plot of the peaking compensated gain of the amplifier shown in FIG. 7 across operating frequency according to certain aspects of the concepts described herein.

FIG. 9 illustrates a representative plot of the peaking compensated gain of the amplifier 30 shown in FIG. 7 across operating frequency. In FIG. 9, each of the curves $G_1$-$G_n$ is plotted for a different gain peaking setting of the amplifier 30, which can be varied. Thus, the gain peaking setting of the amplifier 30 can be designed to provide larger peaking in some settings. As compared to the example shown in FIG.

2B for the amplifier 10, the gain of the amplifier 30 is more linear across the operating bandwidth of the amplifier 10, for all peaking settings of the amplifier 30. Particularly at lower peaking settings (e.g., for curves $G_1$-$G_3$, among others), the curves exhibit better linearity as compared to the amplifier 10. Thus, the useful peaking control range of the amplifier 30 is increased.

Figure 10:
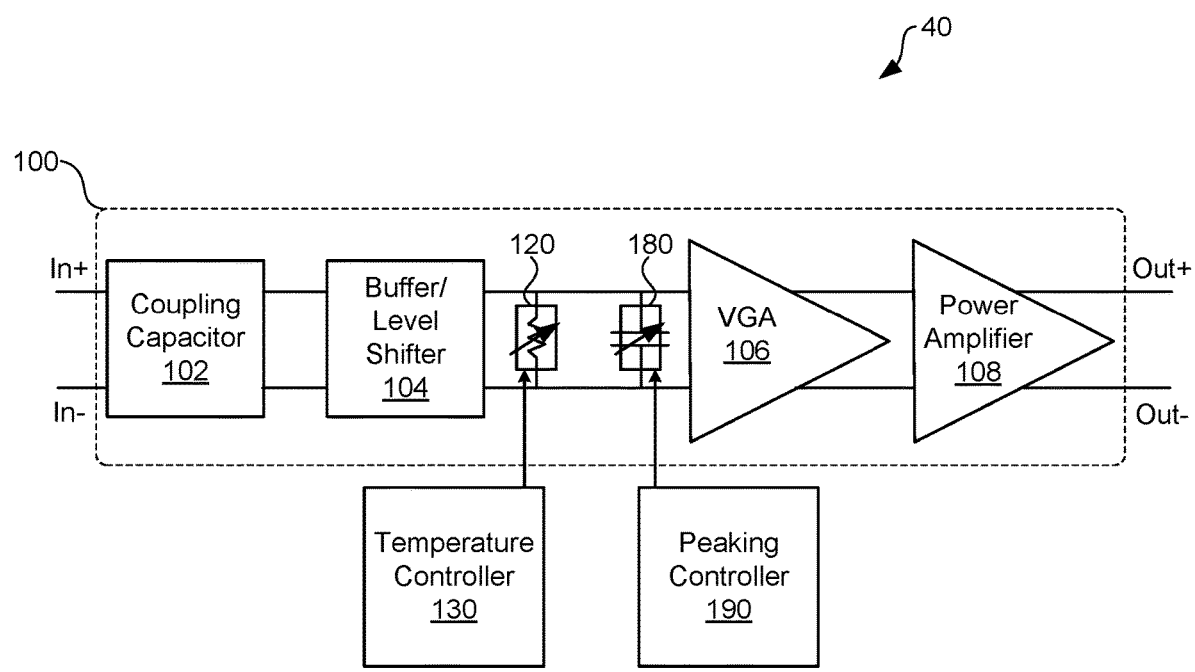
FIG. 10 illustrates an example amplifier with temperature stability and peaking control compensation according to various aspects of the embodiments described herein.

FIG. 10 illustrates an example amplifier 40 with temperature stability and peaking control compensation according to various aspects of the embodiments described herein. As compared to the amplifier 10 shown in FIG. 1, the amplifier 40 also includes the variable resistance 120 coupled between the non-inverting and inverting inputs 121 and 122 of the VGA 106 and the temperature controller 130. The amplifier 40 also includes the negative capacitance 180 coupled between the non-inverting and inverting inputs 121 and 122 of the VGA 106 and the peaking controller 190. Thus, in the example shown in FIG. 10, the amplifier 40 includes both the temperature stability concepts described above with reference to FIG. 3 and the peaking control compensation concepts described above with reference to FIG. 7. In some cases, the operations of the peaking controller 190 can be the same as that of the temperature controller 130, and the peaking controller 190 can be omitted. In that case, the temperature controller 130 can control the operation of both the variable resistance 120 and the negative capacitance 180. However, in other cases, the variable resistance 120 and the negative capacitance 180 can be separately controlled, at least in part, based on different operating concerns and parameters.

The amplifiers described herein, among others consistent with the concepts described herein, can be embodied in hardware or simulated as a number of circuit elements in software. When simulated using software, each circuit element can be embodied as a module or listing of code associated with certain parameters to simulate the element. The software to simulate the circuit elements can include program instructions embodied in the form of, for example, source code that includes human-readable statements written in a programming language or machine code that includes machine instructions recognizable by a suitable execution system, such as a processor in a computer system or other system. If embodied in hardware, each element can represent a circuit or a number of electrically interconnected circuits.

One or more computing devices can execute the software to simulate the circuit elements that form the amplifiers described herein, among others. The computing devices can include at least one processing circuit. Such a processing circuit can include, for example, one or more processors and one or more storage or memory devices coupled to a local interface. The local interface can include, for example, a data bus with an accompanying address/control bus or any other suitable bus structure.

The storage or memory devices can store data or components that are executable by the processors of the processing circuit. For example, data associated with one or more circuit elements of the distributed amplifiers can be stored in one or more storage devices and referenced for processing by one or more processors in the computing devices. Similarly, the software to simulate the circuit elements and/or other components can be stored in one or more storage devices and be executable by one or more processors in the computing devices.

The transistors described herein can be formed using a number of different semiconductor materials and semiconductor manufacturing processes. Example semiconductor materials include the group IV elemental semiconductor materials, including Silicon (Si) and Germanium (Ge), compounds thereof, and the group III elemental semiconductor materials, including Aluminum (Al), Gallium (Ga), and Indium (In), and compounds thereof.

The optimizations in amplifiers can be applied to group III-V direct bandgap active semiconductor devices, such as transistors and amplifiers formed in SiGe semiconductor materials, amplifiers formed in III-Nitride (Aluminum (Al)—, Gallium (Ga)—, Indium (In)—, and their alloys (e.g., AlGaIn)) semiconductor materials, and GaAs, InP, InGaP, AlGaAs, and related semiconductor materials. The principles and concepts can also be applied to transistors and other active devices formed from other semiconductor materials.

The embodiments described herein are applicable for use with amplifiers including GaN-on-Si transistors, among other types of transistors, but the embodiments can also be applied to GaN-on-Silicon Carbide (SiC) transistors, as well as other types of transistors. As used herein, the phrase "gallium nitride material" or GaN semiconductor material refers to gallium nitride and any of its alloys, such as aluminum gallium nitride ($Al_x$ $Ga_{(1-x)}$ N), indium gallium nitride ($In_y$ $Ga_{(1-y)}$ N), aluminum indium gallium nitride ($Al_x$ $In_y$ $Ga_{(1-x-y)}$ N), gallium arsenide phosphide nitride ($GaAs_a$ $P_b$ $N_{(1-a-b)}$), aluminum indium gallium arsenide phosphide nitride ($Al_x$ $In_y$ $Ga_{(1-x-y)}$ $As_a$ $P_b$ $N_{(1-a-b)}$), among others. Typically, when present, arsenic and/or phosphorous are at low concentrations (e.g., less than 5 weight percent). The term "gallium nitride" or GaN semiconductor refers directly to gallium nitride, exclusive of its alloys.

The features, structures, and components described above may be combined in one or more embodiments in any suitable manner, and the features discussed in the various embodiments are interchangeable where technically suitable. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although relative terms such as "on," "below," "upper," "lower," "top," "bottom," "right," and "left" may be used to describe the relative spatial relationships of certain structural features, these terms are used for convenience only, as a direction in the examples. It should be understood that if the device is turned upside down, the "upper" component will become a "lower" component. When a structure or feature is described as being "over" (or formed over) another structure or feature, the structure can be positioned over the other structure, with or without other structures or features intervening between them. When two components are described as being "connected to" or "coupled to" each other, the components can be electrically connected or coupled to each other, with or without other components being electrically coupled and intervening between them. When two components are described as being "directly connected to" or "directly coupled to" each other, the components can be electrically connected or coupled to each other, without other components being electrically coupled between them. Terms such as "a," "an," "the," and "said" are used to indicate the presence of one or more elements and components. The terms "comprise," "include," "have," "contain,"

and their variants are used to be open ended and may include or encompass additional elements, components, etc., in addition to the listed elements, components, etc., unless otherwise specified.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. An amplifier, comprising:
   a variable gain amplifier comprising differential input terminals;
   a power amplifier;
   a compensation element comprising a variable impedance coupled between the differential input terminals of the variable gain amplifier; and
   a controller that controls the compensation element to adjust an operating characteristic of the amplifier.

2. The amplifier of claim 1, wherein the compensation element comprises a resistor and a transistor coupled in series between the differential input terminals of the variable gain amplifier.

3. The amplifier of claim 2, wherein the controller varies an impedance of the compensation element across the differential input terminals of the variable gain amplifier based on temperature to stabilize the amplifier.

4. The amplifier of claim 2, wherein the controller decreases an impedance of the compensation element based on a lower temperature of the amplifier and increases an impedance of the compensation element based on a higher temperature of the amplifier.

5. The amplifier of claim 1, wherein:
   the compensation element comprises a first resistor, a field effect transistor, and a second resistor coupled in series between the differential input terminals of the variable gain amplifier.

6. The amplifier of claim 1, wherein the controller comprises:
   a current source;
   an impedance network that provides a temperature profile voltage based on a current from the current source; and
   an operational amplifier that provides a control voltage to control the operation of the compensation element based on the temperature profile voltage.

7. The amplifier of claim 6, wherein the controller further comprises:
   a resistor voltage divider coupled between an output of the operation amplifier and an input of the operational amplifier, the resistor voltage divider setting a slope of a temperature profile of the controller;
   a second current source that provides a second current; and
   a resistor that provides a reference voltage to the resistor voltage divider based on the second current.

8. The amplifier of claim 7, wherein the reference voltage sets a scale position of the temperature profile of the controller.

9. The amplifier of claim 1, wherein the compensation element further comprises a capacitance.

10. The amplifier of claim 9, wherein the controller varies coupling of the capacitance across the differential input terminals of the variable gain amplifier based on temperature to linearize gain of the amplifier.

11. The amplifier of claim 1, wherein:
    the compensation element further comprises a pair of cross coupled transistors, a capacitor coupled between the pair of cross coupled transistors, and a current source; and
    the capacitance of the capacitor is inverted to a negative capacitance through the pair of cross coupled transistors.

12. The amplifier of claim 11, wherein the controller varies a current sourced by the current source based on a temperature of the amplifier to vary coupling of the negative capacitance across inputs of the variable gain amplifier and linearize the amplifier.

13. An amplifier, comprising:
    a variable gain amplifier comprising differential input terminals;
    a power amplifier;
    a compensation element comprising a variable impedance and a variable capacitance coupled between the differential input terminals of the variable gain amplifier; and
    a controller that controls the compensation element to adjust an operating characteristic of the amplifier.

14. The amplifier of claim 13, wherein the controller varies an impedance of the variable impedance based on temperature to stabilize the amplifier.

15. The amplifier of claim 14, wherein the controller decreases an impedance of the variable impedance based on a lower temperature of the amplifier and increases the impedance of the variable impedance based on a higher temperature of the amplifier.

16. The amplifier of claim 14, wherein:
    the variable impedance comprises a first resistor, a field effect transistor, and a second resistor coupled in series between the differential input terminals of the variable gain amplifier.

17. The amplifier of claim 14, wherein the controller varies coupling of the capacitance across the differential input terminals of the variable gain amplifier based on temperature to linearize the amplifier.

18. The amplifier of claim 14, wherein:
    the variable capacitance comprises a pair of cross coupled transistors, a capacitor coupled between the pair of cross coupled transistors, and a current source; and
    the capacitance of the capacitor is inverted to a negative capacitance through the pair of cross coupled transistors.

19. The amplifier of claim 14, wherein the controller comprises:
    a current source;
    an impedance network that provides a temperature profile voltage based on a current from the current source; and
    an operational amplifier that provides a control voltage to control the compensation element based on the temperature profile voltage.

20. The amplifier of claim 19, wherein the controller further comprises:
    a resistor voltage divider coupled between an output of the operation amplifier and an input of the operational amplifier, the resistor voltage divider setting a slope of a temperature profile of the controller;
    a second current source that provides a second current; and a resistor that provides a reference voltage to the resistor voltage divider based on the second current.

21. An amplifier, comprising:
a variable gain amplifier;
a power amplifier;
a compensation element comprising a variable impedance coupled between differential input terminals of the variable gain amplifier; and
a controller that controls the compensation element to adjust an operating characteristic of the amplifier.

22. The amplifier of claim 21, wherein the controller decreases an impedance of the variable impedance based on a lower temperature of the amplifier and increases an impedance of the variable impedance based on a higher temperature of the amplifier.

23. The amplifier of claim 21, wherein the compensation element comprises a first resistor, a field effect transistor, and a second resistor coupled in series between the differential input terminals of the variable gain amplifier.

24. The amplifier of claim 21, wherein the controller comprises:
a current source;
an impedance network that provides a temperature profile voltage based on a current from the current source; and
an operational amplifier that provides a control voltage to control the operation of the compensation element based on the temperature profile voltage.

25. The amplifier of claim 21, wherein the compensation element further comprises a variable capacitance.

26. The amplifier of claim 25, wherein the controller varies coupling of the capacitance across the differential input terminals of the variable gain amplifier based on temperature to linearize gain of the amplifier.

27. The amplifier of claim 25, wherein:
the variable capacitance comprises a pair of cross coupled transistors, a capacitor coupled between the pair of cross coupled transistors, and a current source; and
the capacitance of the capacitor is inverted to a negative capacitance through the pair of cross coupled transistors.

* * * * *